(12) United States Patent
Fauty et al.

(10) Patent No.: US 7,109,064 B2
(45) Date of Patent: Sep. 19, 2006

(54) METHOD OF FORMING A SEMICONDUCTOR PACKAGE AND LEADFRAME THEREFOR

(75) Inventors: Joseph K. Fauty, Mesa, AZ (US); James Howard Knapp, Gilbert, AZ (US); James P. Letterman, Jr., Mesa, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 56 days.

(21) Appl. No.: 10/729,892

(22) Filed: Dec. 8, 2003

(65) Prior Publication Data

US 2005/0127482 A1 Jun. 16, 2005

(51) Int. Cl.
*H01L 21/44* (2006.01)
*H01L 21/48* (2006.01)
*H01L 21/50* (2006.01)

(52) U.S. Cl. ..................................... 438/123; 438/124

(58) Field of Classification Search ............... None
See application file for complete search history.

(56) References Cited

U.S. PATENT DOCUMENTS

| | | | | |
|---|---|---|---|---|
| 4,490,902 A | * | 1/1985 | Eytcheson et al. ............ 29/827 |
| 4,733,014 A | * | 3/1988 | Fierkens et al. ............ 174/52.4 |
| 5,070,039 A | * | 12/1991 | Johnson et al. ............... 29/827 |
| 5,221,859 A | * | 6/1993 | Kobayashi et al. ......... 257/676 |
| 5,347,709 A | * | 9/1994 | Maejima et al. ............... 29/827 |
| 5,541,447 A | * | 7/1996 | Maejima et al. ............ 257/669 |
| 5,898,216 A | * | 4/1999 | Steffen ....................... 257/679 |
| 6,071,758 A | * | 6/2000 | Steffen ....................... 438/112 |
| 6,335,223 B1 | * | 1/2002 | Takada et al. .............. 438/111 |
| 6,617,200 B1 | * | 9/2003 | Sone .......................... 438/123 |
| 2003/0193080 A1 | * | 10/2003 | Cabahug et al. ............ 257/666 |
| 2004/0084756 A1 | * | 5/2004 | Kawakami et al. ......... 257/666 |

FOREIGN PATENT DOCUMENTS

| | | | |
|---|---|---|---|
| JP | 61134044 A | * | 6/1986 |
| JP | 61201454 A | * | 9/1986 |
| JP | 62156844 A | * | 7/1987 |
| JP | 05067715 A | * | 3/1993 |

* cited by examiner

*Primary Examiner*—David E. Graybill
(74) *Attorney, Agent, or Firm*—Robert F. Hightower

(57) ABSTRACT

A method of forming a leadframe and a semiconductor package using the leadframe facilitates selectively forming leads for the package. The leadframe is formed with a first portion of the leads extending from a panel of the leadframe into a molding cavity section of the leadframe. After encapsultaion, a portion of the leadframe panel is used to form a second portion of the leads that is external to the package body.

13 Claims, 7 Drawing Sheets

METHOD OF FORMING A SEMICONDUCTOR PACKAGE AND LEADFRAME THEREFOR

BACKGROUND OF THE INVENTION

The present invention relates, in general, to packaging, and more particularly, to methods of forming semiconductor packages and leadframes.

In the past, various methods were utilized to manufacture both semiconductor packages and the leadframes utilized in manufacturing the semiconductor packages. One leadframe manufacturing method produced a leadframe having a dambar that extended laterally between the leads and that was connected to each lead of the leadframe. The leads extended past the dam-bar and were attached to a main panel section of the leadframe strip. When the leadframe was molded into a package, the dam-bar was intended to prevent the molding compound from reaching the package leads. The dam-bar had to be positioned sufficiently far from the package body to leave room to excise the dam-bar without damaging the package body. The large space between the package body and the dam-bar allowed the mold material to escape and fill the space. The material also attached to the sides of the leads. This mold material often is referred to as flash or flashing.

Another method produced a leadframe that did not have a dam-bar. The molding equipment or mold that was utilized to produce the semiconductor package had channels or recesses into which the leads were placed. During the molding operation, mold material often traveled through the channels and formed flashing attached to the sides of the leads.

The flashing that resulted from these processes had to be removed from the leads after the molding operations were complete. In some cases, the flashing was along the entire length of the lead and could be up to 0.15 milli-meters thick. Flash removal procedures included using a high-pressure jet of water or of particles or a chemical jet to remove the flashing. The pressure often was in the range of about two hundred fifty to four hundred twenty five Kilograms/square centimeter (250–425 KGm/cm$^2$).

As the size of semiconductor packages and leads for the packages continued to decrease, the leads and the packages became more delicate and more easily damaged. The smaller lead and package sizes made it more difficult to prevent the mold material from escaping the mold cavities, thus, made it more difficult to keep the mold material from adhering to the leads. In some cases the flashing was longer than the finished lead length and could be thicker than the lead width. This made flashing removal very difficult. Additionally, the smaller lead and package size made it more difficult to remove the flashing without damaging the leads and the packages.

Accordingly, it is desirable to have a leadframe having small leads, that reduces the amount of mold material escaping from the mold cavity and along the leads, that reduces the amount of mold material or flashing adhering to the leads, and that minimizes lead damage during flashing removal.

BRIEF DESCRIPTION OF THE DRAWINGS

For simplicity and clarity of illustration, elements in the figures are not necessarily to scale, and the same reference numbers in different figures denote the same elements. Additionally, descriptions and details of well-known steps and elements are omitted for simplicity of the description.

DETAILED DESCRIPTION OF THE DRAWINGS

Figure 1:
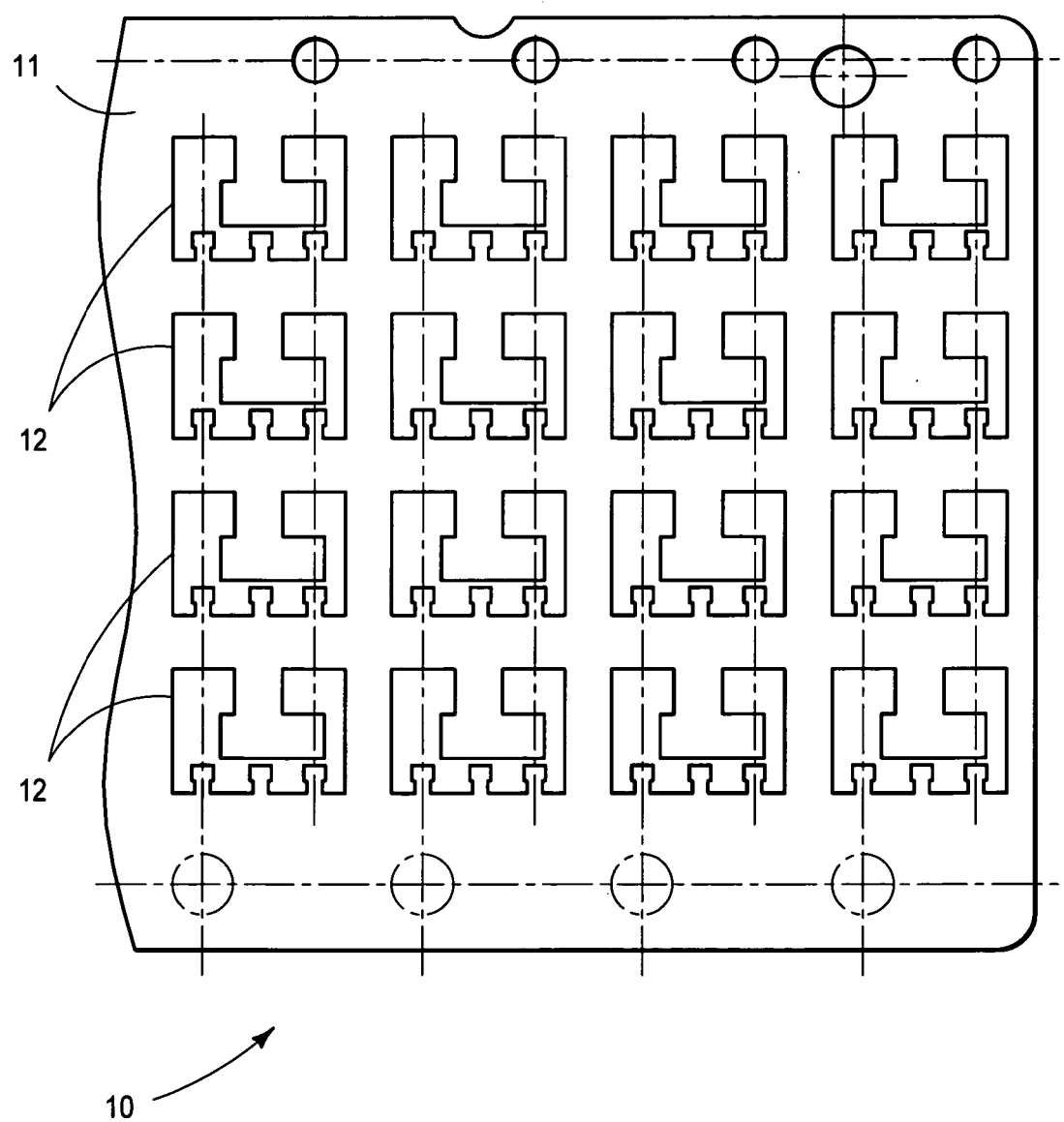
FIG. 1 illustrates an enlarged plan view of a portion of an embodiment of a leadframe in accordance with the present invention.

FIG. 1 illustrates an enlarged plan view of a portion of an embodiment of a leadframe strip or leadframe 10. Leadframe 10 typically is produced as a strip that has a plurality of package sites 12 at which semiconductor packages are to be formed. Leadframe 10 includes a main panel section or main panel 11 that typically supports the other elements of leadframe 10 during the manufacturing process. As is well known in the art, main panel 11 typically is a long thin sheet of metal such as copper or alloy 42. In most embodiments, panel 11 is less than about 0.6 millimeters thick, and preferably is about 0.25 millimeters thick.

Figure 2:
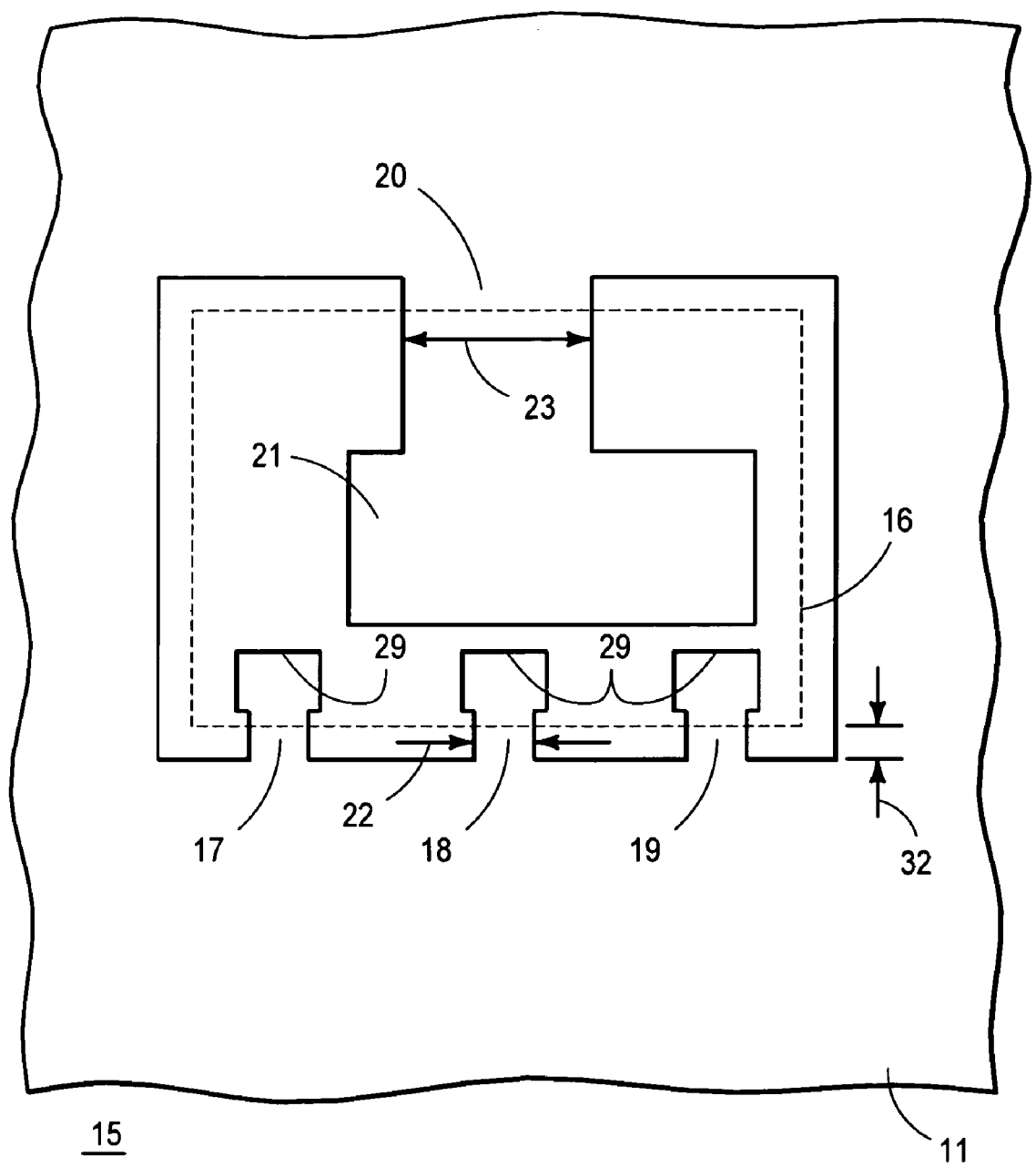
FIG. 2 illustrates an enlarged plan view of an embodiment of a portion of the leadframe of FIG. 1 in accordance with the present invention.

FIG. 2 illustrates a further enlarged plan view of leadframe 10 of FIG. 1 illustrating an embodiment of a portion of one package site 15 of the plurality of package sites 12 shown in FIG. 1. This explanation has references to both FIG. 1 and FIG. 2. Site 15, and typically each site 12, includes a cavity section 16 which is intended to be encapsulated during the process of forming a semiconductor package from leadframe 10. An outer edge of cavity section 16 is illustrated in general by a dashed box. Panel 11 surrounds cavity section 16 and extends up to a distance 32 from the outer edge of cavity section 16. In some embodiments, panel 11 may be a different distance from one side of cavity section 16 than from another side. Distance 32 is described in more detail subsequently. Site 15, thus sites 12 and leadframe 10, includes a plurality of leads that includes leads 17, 18, 19, and 20 that extend from panel 11 into cavity section 16. Leads 17, 18, 19, and 20 may be referred to hereinafter as the plurality of leads or as leads 17–20. Leads 17–19 are illustrated to have a width 22 and lead 20 has a width 23 that is larger than width 22. For clarity of the description and drawings, four leads are illustrated, however, those skilled in the art realize various numbers of leads may extend into cavity section 16 and that each lead may have the same or different widths. A distal end 29 of leads 17–19 is within cavity section 16. A distal end of lead 20 is also within cavity section 16 and has a die attach area or flag 21 within cavity section 16 that is formed for attaching a semiconductor die thereto. Leads 17–20 extend distance 32 out of cavity section 16 where a proximal end of each lead 17–20 is attached to panel 11. The portion of leads 17–20 that is within cavity section 16 is referred to as an internal portion of lead 17–20. The portion of leads 17–20 that is external to section 16 is referred to as an external portion of leads 17–20. Distal end 29 of leads 17–19, have a bonding area that typically will be utilized for attaching bonding wires to the semiconductor die that will be attached to flag 21. The bonding areas may also be utilized for direct chip attach or flip-chip attach to leads 17–19. Such flags, bonding areas, and attachment methods are well known to those skilled in the art.

Figure 3:
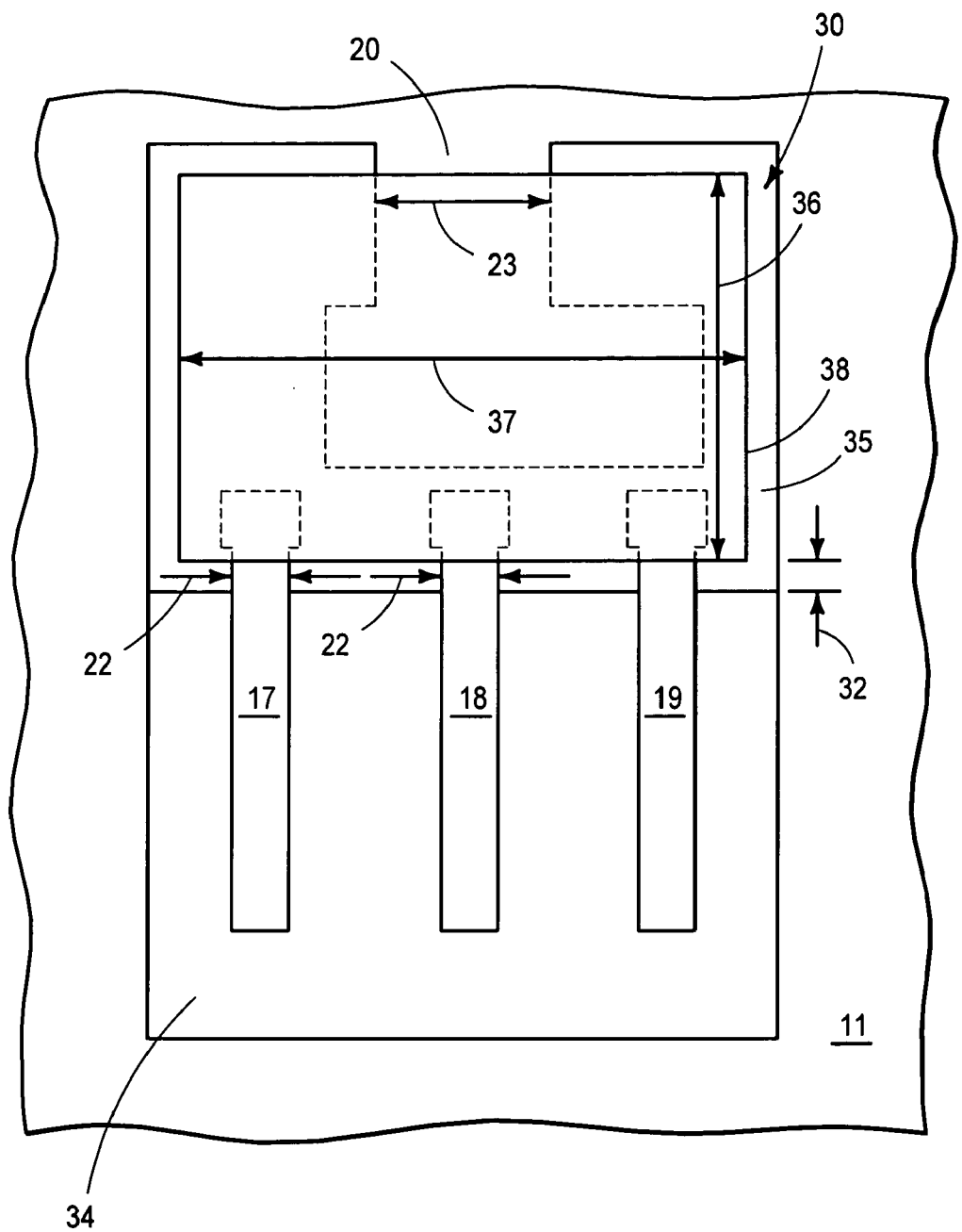
FIG. 3 illustrates a plan view of the portion of the leadframe of FIG. 2 at a stage of manufacturing a semiconductor package in accordance with the present invention.

FIG. 3 illustrates a plan view of site 15 explained in the description of FIG. 2 after several steps in the process of manufacturing a semiconductor package 30 using leadframe 10. As is well known in the art, a semiconductor die (not shown) typically is attached to flag 21 and wire bonded to leads 17–20. Subsequently, leadframe 10 is placed into a mold and cavity section 16 is encapsulated. During the encapsulation process, the mold is closed on leadframe 10. A molding cavity within the mold typically corresponds to the shape and location of cavity section 16. The mold clamps down on the portion of leads 17–20 outside of cavity section 16 and on the portion of panel 11 that surrounds cavity section 16. During the encapsulation step, the portion of panel 11 external to cavity section 16 and the external portion of leads 17–20 between panel 11 and cavity section 16 block the encapsulation material and restrict it from escaping the mold cavity. Thus, it is important that distance 32 be very small to prevent the encapsulating material from escaping and adhering to leads 17–20. Distance 32 is selected to minimize and preferably prevent encapsulation compound from escaping the mold cavity and attaching to leads 17–20 during the encapsulation process. In order to accomplish this, distance 32 typically is no greater than about fifty (50) microns and preferably is no greater than about ten (10) microns from the outer edge of cavity section 16. Some encapsulating material may escape from the mold cavity into the space formed by distance 32. Thus it is also important for distance 32 to be small to minimize the amount of flashing accumulated in the opening formed by distance 32.

After the encapsulation and subsequent curing operations, a package body 38 is left encapsulating cavity section 16 and surrounding the distal ends of leads 17–20. Body 38 typically has a length 37 and a width 36 that is less than length 37. In other embodiments length 37 and width 36 may be approximately equal.

Subsequent to the molding operation, leads 17–20 are trimmed and formed to desired lengths and widths from the material of panel 11. Subsequently, leads 17–20 are plated and package 30 is then excised from panel 11. As will be seen further hereinafter, these operations may be performed in various sequences.

In the preferred embodiment, leads 17–20 are first trimmed and formed using a first portion of the material of panel 11 to form the additional length or portion of leads 17–20 extending to a proximal end of leads 17–20. In this preferred embodiment, leads 17–19 are trimmed to a width that is approximately equal to width 22 of the distal portion of leads 17–19 and lead 20 is trimmed to a width that is approximately equal to width 23 of the distal portion of lead 20 that is illustrated in FIG. 2. A variety of trim and form tools that are well known in the art can be used to trim and form leads 17–20 from panel 11. One example of a suitable trim and form tool is a Diehard Engineering model MPS C286 manufactured by Diehard Engineering, Inc. of Pleasanton, Calif. In this embodiment, leads 17–20 are formed to a width that is no greater than approximately 0.5 millimeters and a length that is between approximately 1.0 and 2.5 millimeters. Also, body 38 is formed with a width that is between approximately one and five (1–5) millimeters and a length that is between one and five (1–5) millimeters. The trimming operation leaves an opening 34 through panel 11 to expose leads 17–20.

Figure 4:
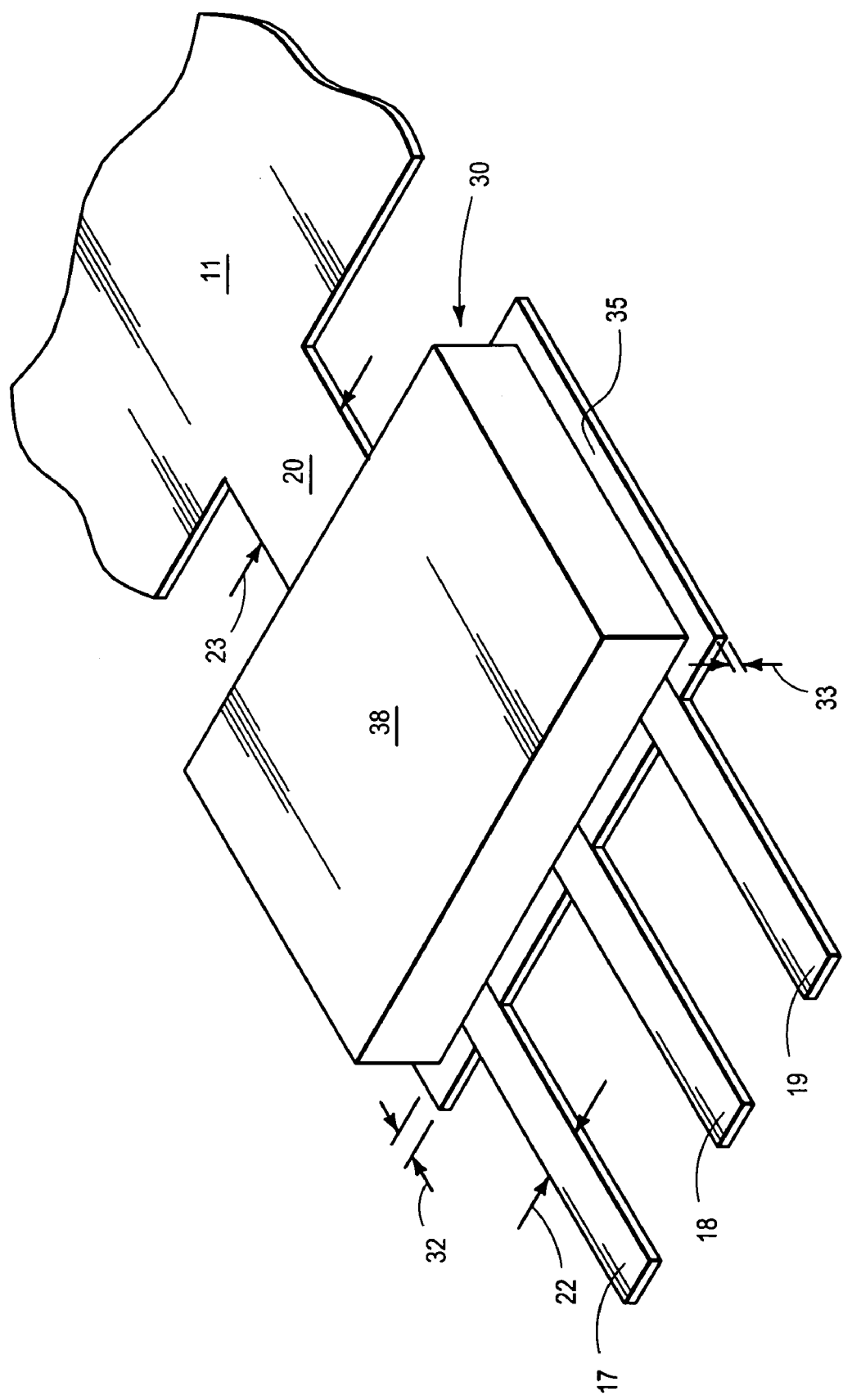
FIG. 4 illustrates an isometric view of the portion of the leadframe of FIG. 3 at a subsequent stage of manufacturing the semiconductor package in accordance with the present invention.

FIG. 4 illustrates an isometric view of site 15 of FIG. 3 at a subsequent stage of manufacturing semiconductor package 30. After the trim and form operation, all of package 30 except the proximal end of lead 20 is excised from panel 11. This attachment to panel 11 assists in the handling and placement of package 30 during other manufacturing operations. It should be noted that a small amount of the encapsulation material may escape the mold cavity into distance 32 and adhere to the outside of body 38 as a flashing 35. However, the small dimensions of distance 32 limits the width of flashing 35 to less than distance 32. Thus, flashing 35 does not affect the ability to attach package 30 to other substrates. After this partial excising operation, leads 17–20 are plated by electroplating or various other well know plating operations. By forming leads 17–20 prior to plating, the sides and ends of all leads, except the proximal end of lead 20, are plated during this operation. Package 30 is subsequently excised from panel 11 by excising the connection between lead 20 and panel 11. It can be seen that forming panel 11 no further than distance 32 from cavity section 16 eliminates the need for a dam-bar and minimizes the amount of flashing adhering to leads 17–20. Thus, there is no dam-bar between panel 11 and cavity section 16. Because of the small length of distance 32, flashing removal steps are not required after forming and excising package 30. Eliminating the flashing removal steps eliminates the lead damage caused by such operations thereby improving manufacturing yield and reducing costs.

In another embodiment, the proximal end of other leads of leads 17–20, or all of leads 17–20, can remain attached to panel 11 after forming leads 17–20. For example, a proximal end of leads 17 and 19 can remain attached with leads 18 and 20 excised. Then leads 17–20 can be plated and the attached leads can subsequently be excised to form package 30.

In still another embodiment, package 30 can be plated prior to trimming and forming leads 17–20 from panel 11, then leads 17–20 can be formed from panel 11 and package 30 can be excised. Thus, it can be seen that a portion of leads 17–20, for example a portion of the external portion of leads 17–20, is formed by excising a first portion of the main panel away from the plurality of leads and leaving a second portion of the main panel as a portion of the plurality leads extending greater than distance 32 from package body 38.

In an additional embodiment all of leads 17–20 may be trimmed and formed from panel 11, then excised from panel 11 to form package 30. Leads 17–20 can then be plated by various well-known means, for example by barrel plating.

Figure 5:
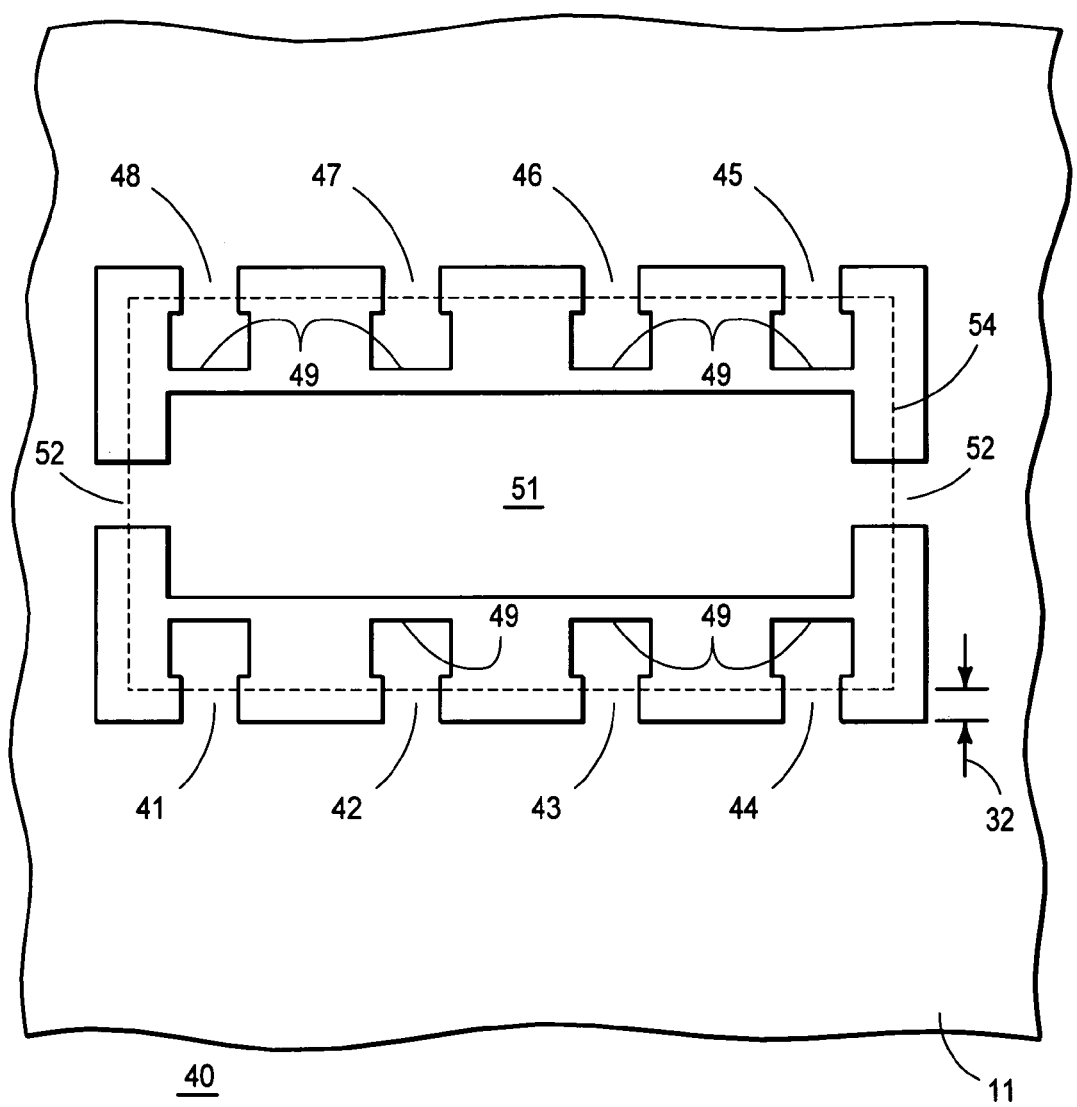
FIG. 5 illustrates an enlarged plan view of a portion of another embodiment of a leadframe at a stage of manufacturing a semiconductor package in accordance with the present invention.

FIG. 5 illustrates an enlarged plan view of an embodiment of a portion of a package site 40 that is an alternate embodiment of site 15 explained in the description of FIG. 2 through FIG. 4. Site 40 is one site of a plurality of sites formed on main panel 11 of leadframe 10. Site 40 includes a cavity section 54 that functions similarly to section 16. Site 40 also has a plurality of leads that includes leads 41, 42, 43, 44, 45, 46, 47, and 18 that extend from panel 11 into cavity section 54. Leads 41–48 are similar to and function similarly to leads 17–20. The portion of leads 41–48 within cavity section 54 forms an internal portion of each respective lead. An external portion of each lead is outside of cavity section 54. A distal end 49 of each lead 41–48 is within cavity section 54. Site 40 also has a flag 51 within section 54. Flag 51 is attached to panel 11 by tabs 52 that extend from flag 51 through cavity section 54 to panel 11.

Figure 6:
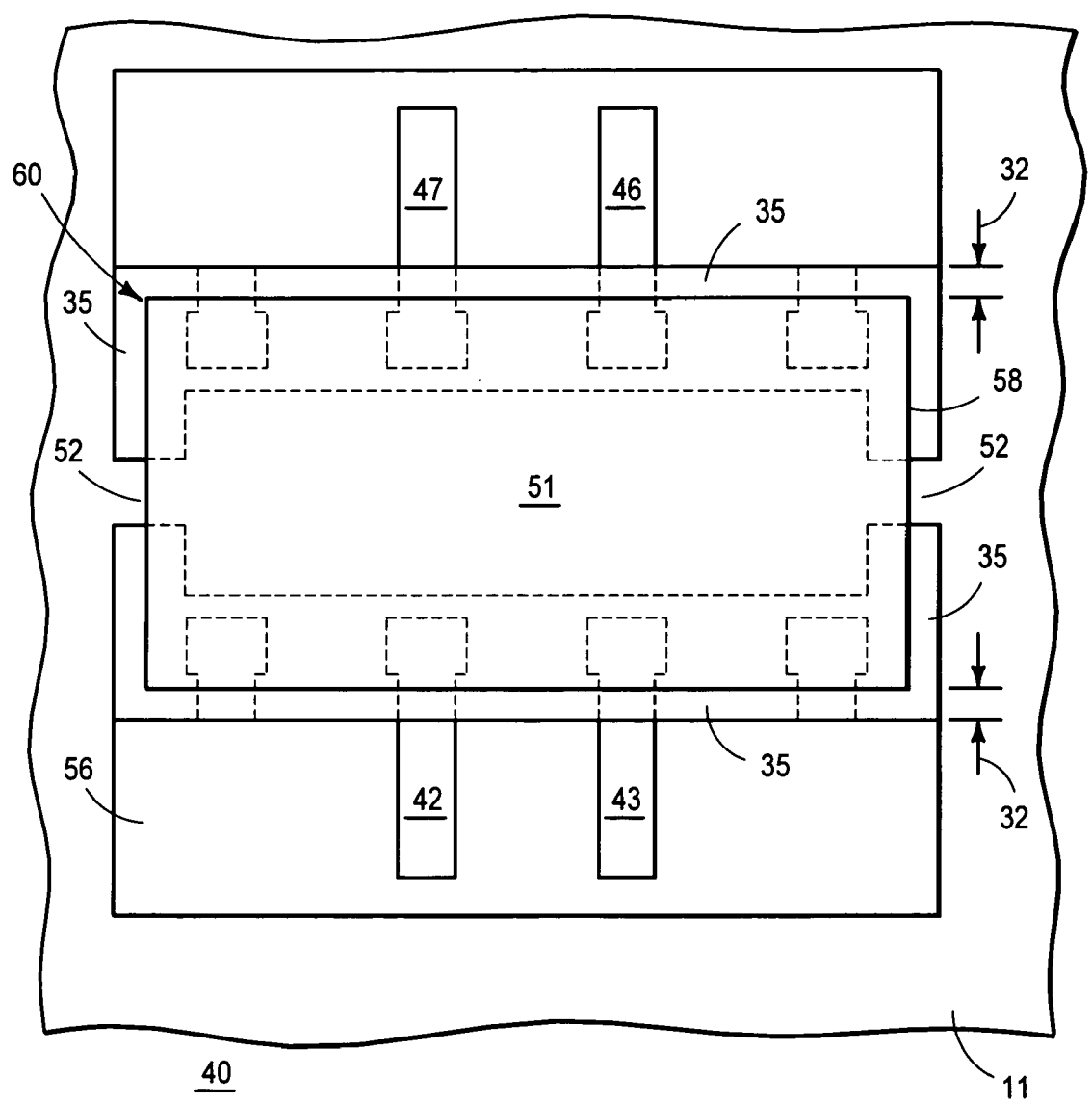
FIG. 6 illustrates an enlarged plan view of the portion of the leadframe of FIG. 5 at a subsequent stage of manufacturing the semiconductor package in accordance with the present invention.

FIG. 6 illustrates a plan view of site 40 explained in the description of FIG. 5 after several steps in the process of manufacturing a semiconductor package 60 using leadframe 10. Package 60 is manufactured by selectively forming a desired set of external leads for package 60 after site 40 is encapsulated. Typically a die (not shown) is attached to flag 51 and electrically connected to the desired number of leads 41–48. In the example shown in FIG. 6, the die is electrically connected to leads 42, 43, 46, and 47. Leadframe 10 is subsequently placed into a mold and cavity section 54 is encapsulated as explained in the description of package 30. During the encapsulation process, panel 11 and distance 32 minimize the amount of encapsulation material escaping from the mold cavity as described hereinbefore.

Subsequent to the encapsulation operation, leads 41–48 are selectively trimmed and formed to desired lengths and widths from the material of panel 11. Since only four leads have external portions, leads 42, 43, 46, and 47 are selectively formed from the material of panel 11 and the material of panel 11 is trimmed away from the location of the external portions of leads 41, 44, 45, and 48. During the trimming operation, leads 41, 44, 45, and 48 are trimmed approximately even with body 58. Subsequently, leads 42, 43, 46, and 47 are plated and package 60 is then excised from panel 11 in a manner similar to the formation of package 30.

Figure 7:
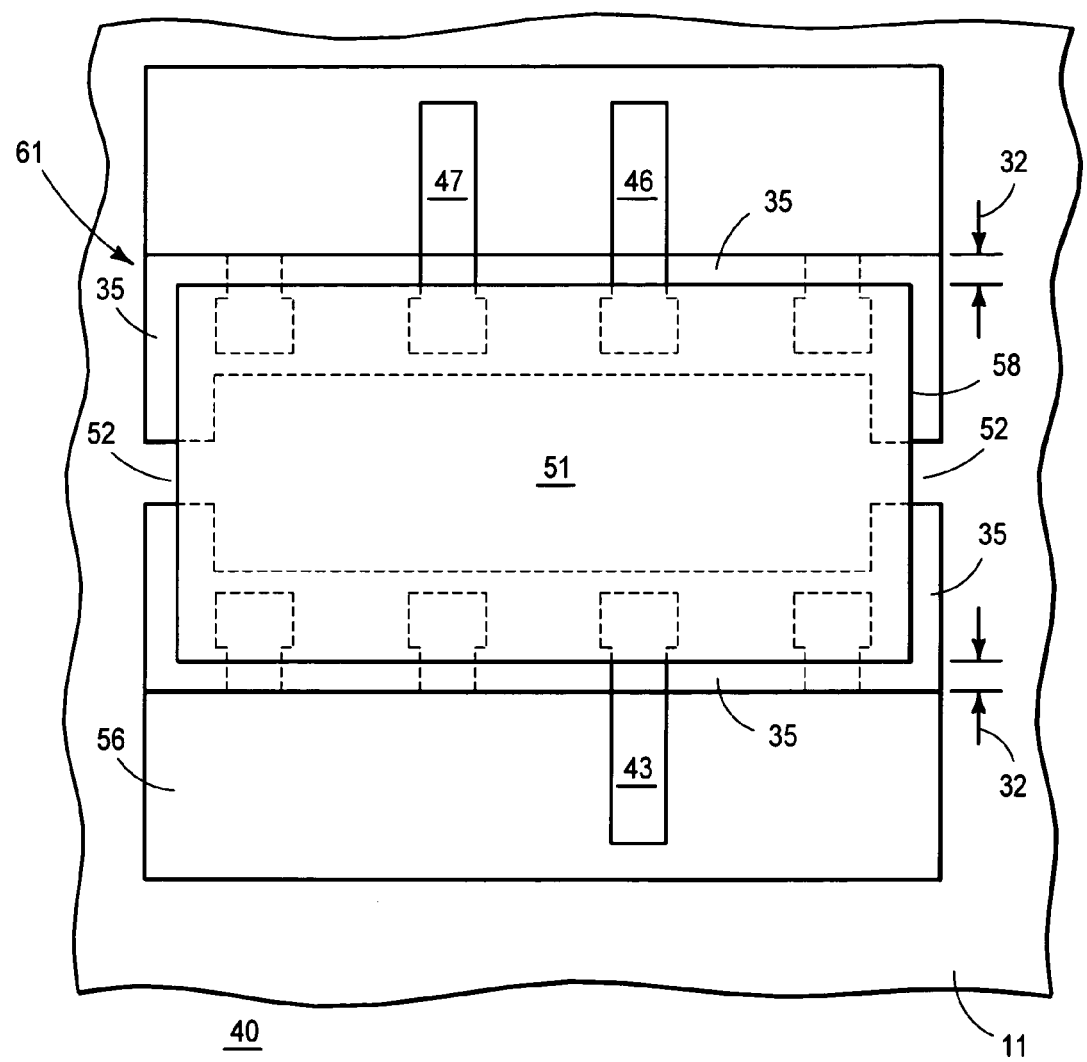
FIG. 7 illustrates an enlarged plan view of a portion of another embodiment of the leadframe of FIG. 5 at a stage of manufacturing an alternated embodiment of the semiconductor package of FIG. 6 in accordance with the present invention.

FIG. 7 illustrates an enlarged plan view of a package 61 that is an alternate embodiment of package 60. Package 61 is manufactured by selectively forming a desired set of three leads for package 61 after site 40 is encapsulated. Subsequent to the encapsulation operation, leads 41–48 are trimmed and formed to desired lengths and widths from the material of panel 11. Since package 61 only has three leads, leads 43, 46, and 47 are selectively formed from the material of panel 11 and the material of panel 11 is trimmed away from the location of the external portions of leads 41, 42, 44, 45, and 48. Subsequently, leads 43, 46, and 47 are plated and package 61 is then excised from panel 11 in a manner similar to the formation of package 30.

As can be seen from the description of FIG. 5 through FIG. 7, a package site may have any number of internal lead portions internal to a cavity section, such as cavity sections 16 and 54. Typically the maximum number of internal lead portions is determined by the size of the package, lead widths, and spacings. However, a desired number of external leads may be selectively formed from the internal lead portions. Thus, it can be seen that the external lead portions may be selected to be less than the number of internal lead portions. Selectively forming the number of external leads after encapsulation allows one package site, thus one leadframe configuration, to be used for several different package configurations, thereby reducing the manufacturing costs.

In view of all of the above, it should be evident that a novel method of forming a semiconductor package and leadframe therefor is disclosed. Extending the leadframe panel near the cavity section of the leadframe allows using the panel to minimize the encapsulating material escaping during the encapsulating operation thereby minimizing flashing on the package body and on the leads. Trimming and forming the leads from the panel material after the encapsulating operating also facilitates using the panel to block the encapsulating material. Reducing flashing from the leads minimizes the flash removal procedures thereby increasing the assembly yields and reducing costs.

The invention claimed is:

1. A method of forming a semiconductor package comprising:
providing a leadframe having a main panel, a cavity section, and a plurality of leads extending from the main panel into the cavity section, the main panel no greater than a first distance from an outer edge of the cavity section and at least a first lead of the plurality of leads extending no greater than the first distance from the cavity section toward the main panel with a proximal end of the first lead attaching to the main panel at an intersection of the first lead and the main panel wherein the main panel is coterminous with the proximal end of the first lead and does not extend past the proximal end of the first lead toward the cavity section;
encapsulating the cavity section of the leadframe to form a package body;
mechanically removing a first portion of the main panel and leaving a second portion of the main panel to form a portion of the first lead extending greater than the first distance from the package body; and
excising a third portion of the main panel away from the first lead.

2. The method of claim 1 wherein providing the leadframe having the main panel, the cavity section, and the plurality of leads extending from the main panel into the cavity section, the main panel no greater than the first distance from an outer edge of the cavity section includes forming the first distance no greater than approximately fifty microns.

3. The method of claim 1 wherein excising the third portion of the main panel away from the first lead includes leaving a third portion of the main panel attached to an end of at least one lead of the plurality of leads.

4. The method of claim 3 further including plating exposed portions of the plurality of leads.

5. The method of claim 4 further including excising the end of the at least one lead of the plurality of leads from the main panel after plating exposed portions of the plurality of leads.

6. The method of claim 1 wherein mechanically removing the first portion of the main panel and leaving the second portion of the main panel includes trimming the main panel to form the portion of the plurality of leads.

7. The method of claim 1 wherein mechanically removing the first portion of the main panel and leaving the second portion of the main panel includes forming the portion of the first lead extending no greater than about fifty microns from the package body.

8. The method of claim 1 further including plating the plurality of leads and the main panel prior to the step of forming the first portion of the main panel into the portion of the first lead.

9. The method of claim 1 wherein mechanically removing the first portion of the main panel and leaving the second portion of the main panel includes selectively forming the second portion of the main panel into a number of leads that is less than all of the plurality of leads.

10. The method of claim 1 wherein mechanically removing the first portion of the main panel and leaving the second portion of the main panel includes forming the second portion of the main panel into a number of leads that is equal to all of the plurality of leads.

11. The method of claim 1 wherein providing the leadframe having the main panel, the cavity section, and the plurality of leads extending from the main panel into the cavity section, the main panel no greater than the first distance from the outer edge of the cavity section includes forming the leadframe devoid of a dam-bar between the main panel and the cavity section.

12. A semiconductor packaging method comprising:
providing a leadframe having a main panel, a cavity section, and a plurality of leads extending from the main panel into the cavity section, at least a first lead of the plurality of leads extending no greater than a first distance from the cavity section toward the main panel; and
mechanically removing a first portion of the main panel and leaving a second portion of the main panel attached to the first lead to form a portion of the first lead extending greater than the first distance from the cavity section.

13. A method of forming a semiconductor package comprising:
providing a leadframe having a main panel, a cavity section, and a plurality of leads extending from the main panel into the cavity section, the main panel no greater than a first distance from an outer edge of the cavity section and at least a first lead of the plurality of leads extending no greater than the first distance from the cavity section toward the main panel and intersecting with the main panel to form an intersection without the main panel extending closer to the cavity section than the intersection;
encapsulating the cavity section of the leadframe to form a package body without the main panel extending closer to the cavity section than the intersection;
mechanically removing a first portion of the main panel and leaving a second portion of the main panel to form a portion of the first lead extending greater than the first distance from the package body; and
excising a third portion of the main panel away from the first lead.

* * * * *